United States Patent
Hayashida et al.

(10) Patent No.: US 10,748,830 B2
(45) Date of Patent: Aug. 18, 2020

(54) SEMICONDUCTOR DEVICE

(71) Applicant: Mitsubishi Electric Corporation, Tokyo (JP)

(72) Inventors: Yukimasa Hayashida, Tokyo (JP); Daisuke Oya, Tokyo (JP); Takayuki Matsumoto, Fukuoka (JP); Ryutaro Date, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/098,901

(22) PCT Filed: Sep. 20, 2016

(86) PCT No.: PCT/JP2016/077664
§ 371 (c)(1),
(2) Date: Nov. 5, 2018

(87) PCT Pub. No.: WO2018/055667
PCT Pub. Date: Mar. 29, 2018

(65) Prior Publication Data
US 2019/0206757 A1    Jul. 4, 2019

(51) Int. Cl.
*H01L 23/31* (2006.01)
*H01L 23/373* (2006.01)
(Continued)

(52) U.S. Cl.
CPC .......... *H01L 23/3142* (2013.01); *H01L 23/10* (2013.01); *H01L 23/28* (2013.01);
(Continued)

(58) Field of Classification Search
CPC .................................................. H01L 2924/14
See application file for complete search history.

(56) References Cited

U.S. PATENT DOCUMENTS 6,060,774 A * 5/2000 Terui .................... H01L 23/3128
257/692
6,072,239 A * 6/2000 Yoneda ............... H01L 21/4832
257/730
(Continued)

FOREIGN PATENT DOCUMENTS

JP   S55-003617 A   1/1980
JP   H4-070752 U   6/1992
(Continued)

OTHER PUBLICATIONS

International Search Report issued in PCT/JP2016/077664; dated Dec. 13, 2016.
(Continued)

*Primary Examiner* — Thao P Le
(74) *Attorney, Agent, or Firm* — Studebaker & Brackett PC

(57) ABSTRACT

A wiring board (2) is provided on a heat radiation plate (1). A semiconductor chip (8) is provided on the wiring board (2). A case housing (10) is provided on the heat radiation plate (1) and surrounds the wiring board (2) and the semiconductor chip (8). Adhesive agent (11) bonds a lower surface of the case housing (10) and an upper surface peripheral portion of the heat radiation plate (1). A sealing material (13) is filled in the case housing (10) and covers the wiring board (2) and the semiconductor chip (8). A step portion (16,17) is provided to at least one of the lower surface of the case housing (10) and the upper surface peripheral portion of the heat radiation plate (1). A side surface of the heat radiation plate (1) and an outer side surface of the case housing (10) are flush with each other.

10 Claims, 6 Drawing Sheets

(51) Int. Cl.
　　　*H01L 23/498* (2006.01)
　　　*H01L 23/28* (2006.01)
　　　*H01L 23/36* (2006.01)
　　　*H01L 23/10* (2006.01)
　　　*H01L 25/18* (2006.01)
　　　*H01L 25/07* (2006.01)
　　　*H01L 23/34* (2006.01)
　　　*H01L 23/48* (2006.01)
　　　*H01L 23/488* (2006.01)
　　　*H01L 23/00* (2006.01)
　　　*H01L 23/24* (2006.01)
　　　*H01L 23/053* (2006.01)

(52) U.S. Cl.
　　　CPC ...... *H01L 23/3114* (2013.01); *H01L 23/3121* (2013.01); *H01L 23/34* (2013.01); *H01L 23/36* (2013.01); *H01L 23/3735* (2013.01); *H01L 23/481* (2013.01); *H01L 23/488* (2013.01); *H01L 23/49811* (2013.01); *H01L 24/32* (2013.01); *H01L 24/49* (2013.01); *H01L 24/73* (2013.01); *H01L 25/07* (2013.01); *H01L 25/18* (2013.01); *H01L 23/053* (2013.01); *H01L 23/24* (2013.01); *H01L 24/48* (2013.01); *H01L 2224/48091* (2013.01); *H01L 2224/48227* (2013.01); *H01L 2224/73265* (2013.01); *H01L 2924/00014* (2013.01); *H01L 2924/1033* (2013.01); *H01L 2924/10254* (2013.01); *H01L 2924/10272* (2013.01); *H01L 2924/1203* (2013.01); *H01L 2924/13055* (2013.01); *H01L 2924/13091* (2013.01); *H01L 2924/16152* (2013.01); *H01L 2924/16315* (2013.01)

(56) References Cited

U.S. PATENT DOCUMENTS

| | | | | |
|---|---|---|---|---|
| 6,365,433 | B1* | 4/2002 | Hyoudo | H01L 21/50 |
| | | | | 257/529 |
| 7,497,597 | B2* | 3/2009 | Suehiro | H01L 33/56 |
| | | | | 257/100 |
| 7,800,124 | B2* | 9/2010 | Urano | H01L 33/483 |
| | | | | 257/98 |
| 2002/0047189 | A1* | 4/2002 | Miyaki | H01L 23/49506 |
| | | | | 257/666 |
| 2003/0153124 | A1* | 8/2003 | Tomimatsu | H01L 23/49575 |
| | | | | 438/109 |
| 2005/0046032 | A1* | 3/2005 | Naruse | H01L 23/3107 |
| | | | | 257/772 |
| 2010/0237375 | A1* | 9/2010 | Yamazaki | H01L 33/507 |
| | | | | 257/98 |
| 2012/0302009 | A1* | 11/2012 | Sekihara | H01L 24/78 |
| | | | | 438/121 |
| 2013/0082334 | A1* | 4/2013 | Nakamura | H01L 23/49524 |
| | | | | 257/401 |
| 2017/0285329 | A1* | 10/2017 | Uchiyama | G02B 26/0833 |
| 2019/0109059 | A1* | 4/2019 | Ohara | H01L 23/3121 |

FOREIGN PATENT DOCUMENTS

| | | |
|---|---|---|
| JP | H5-166950 A | 7/1993 |
| JP | H11-186463 A | 7/1999 |
| JP | H11-214612 A | 8/1999 |
| JP | H11-307658 A | 11/1999 |
| JP | 2000-323593 A | 11/2000 |
| JP | 2005-322874 A | 11/2005 |
| JP | 2010-251614 A | 11/2010 |

OTHER PUBLICATIONS

Written Opinion issued in PCT/JP2016/077664; dated Dec. 13, 2016.

Notification of Transmittal of the International Search Report and the Written Opinion of the International Searching Authority, or the Declaration ssued in PCT/JP2016/077664; dated Dec. 13, 2016.

An Office Action mailed by the Japanese Patent Office dated Oct. 29, 2019, which corresponds to Japanese Patent Application No. 2018-540511 and is related to U.S. Appl. No. 16/098,901; with English translation.

* cited by examiner

SEMICONDUCTOR DEVICE

FIELD

The present invention relates to a semiconductor device used for motor control of, for example, railway equipment or automotive equipment.

BACKGROUND

In a semiconductor device with a case housing filled with gel, the case housing and a heat radiation plate are adhesively bonded to each other with adhesive agent. This makes it possible to prevent moisture intrusion from a joint portion or leakage of the gel to the outside. However, in order to secure a certain volume of the adhesive agent coated on the heat radiation plate, the case housing encloses the heat radiation plate therein. Accordingly, the size of the heat radiation plate must be made smaller than that of the case housing. Furthermore, when there is no step portion both on a case housing side and on a heat radiation plate side (see Patent Literature 1, for example), there is a concern that a sealing function of the adhesive agent would be impaired because the adhesive agent is crushed and the volume of the adhesive agent itself is lost.

CITATION LIST

Patent Literature

[PTL 1] JP H11-214612 A

SUMMARY

Technical Problem

When the size of the heat radiation plate is made smaller than that of the case housing, it would be impossible to expand a thermal diffusion range. Also, the heat radiation function cannot be maximized due to limitation of the size of the heat radiation plate. Furthermore, in recent years, in connection with promotion of miniaturization of semiconductor devices, it is becoming difficult to secure, on the heat radiation plate, a fitting hole diameter for attachment to a cooler under a state where the size of the heat radiation plate is still limited.

The present invention has been made to solve the problem as described above, and an object of the present invention is to obtain a semiconductor device that can ensure a sealing effect, reduce contact thermal resistance, and enhance the likelihood of cooling design.

Solution to Problem

A semiconductor device according to the present invention includes: a heat radiation plate; a wiring board provided on the heat radiation plate; a semiconductor chip provided on the wiring board; a case housing provided on the heat radiation plate and surrounding the wiring board and the semiconductor chip; adhesive agent bonding a lower surface of the case housing and an upper surface peripheral portion of the heat radiation plate; and a sealing material filled in the case housing and covering the wiring board and the semiconductor chip, wherein a step portion is provided to at least one of the lower surface of the case housing and the upper surface peripheral portion of the heat radiation plate, and a side surface of the heat radiation plate and an outer side surface of the case housing are flush with each other.

Advantageous Effects of Invention

In the present invention, the step portion is provided to at least one of the lower surface of the case housing and the upper surface peripheral portion of the heat radiation plate. As a result, it is possible to secure a certain volume of the adhesive agent for adhesively bonding the case housing and the heat radiation plate, thereby ensuring the sealing effect. Furthermore, the side surface of the heat radiation plate and the outer side surface of the case housing are flush with each other. As a result, a heat radiation range can be expanded, thus it is possible to reduce the contact thermal resistance and improve the likelihood of cooling design.

DESCRIPTION OF EMBODIMENTS

A semiconductor device according to the embodiments of the present invention will be described with reference to the drawings. The same components will be denoted by the same symbols, and the repeated description thereof may be omitted.

First Embodiment

Figure 1:
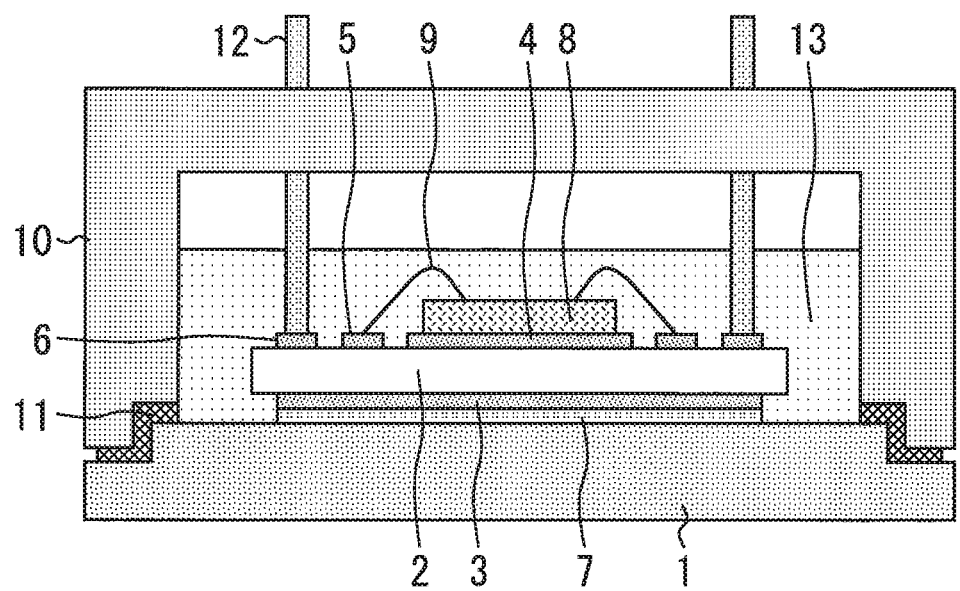
FIG. 1 is a cross-sectional view showing a semiconductor device according to a first embodiment of the present invention.

FIG. 1 is a cross-sectional view showing a semiconductor device according to a first embodiment of the present invention. A wiring board 2 is provided on a heat radiation plate 1. The heat radiation plate 1 is formed of metal such as Cu, AlSiC or Al. The wiring board 2 is constructed of a ceramic substrate or the like provided with a lower surface electrode 3 on the lower surface thereof and provided with upper surface electrodes 4, 5, 6 on the upper surface thereof. The lower surface electrode 3 of the wiring board 2 is bonded to the heat radiation plate 1 with solder 7. A semiconductor chip 8 is provided on the upper surface electrode 4 of the wiring board 2. The upper surface electrode of the semiconductor chip 8 is connected to the upper surface electrode 5 of the wiring board 2 by wires 9.

The case housing 10 is provided on the heat radiation plate 1 surrounding the wiring board 2 and the semiconductor chip 8. The case housing 10 is an engineering plastic such as PPS, PBT or PET+PBT, for example. The lower surface of the case housing 10 and an upper surface peripheral portion of the heat radiation plate 1 are adhesively bonded to each other with adhesive agent 11. The adhesive agent 11 is a silicone-based or epoxy-based material or the like.

Electrode terminals 12 are connected to the upper surface electrode 6 of the wiring board 2, and led out to the outside of the case housing 10. In order to ensure insulation, the case housing 10 is filled with an insulating sealing material 13 such as a silicone gel to cover the wiring board 2, the semiconductor chip 8, and the like.

Figure 2:
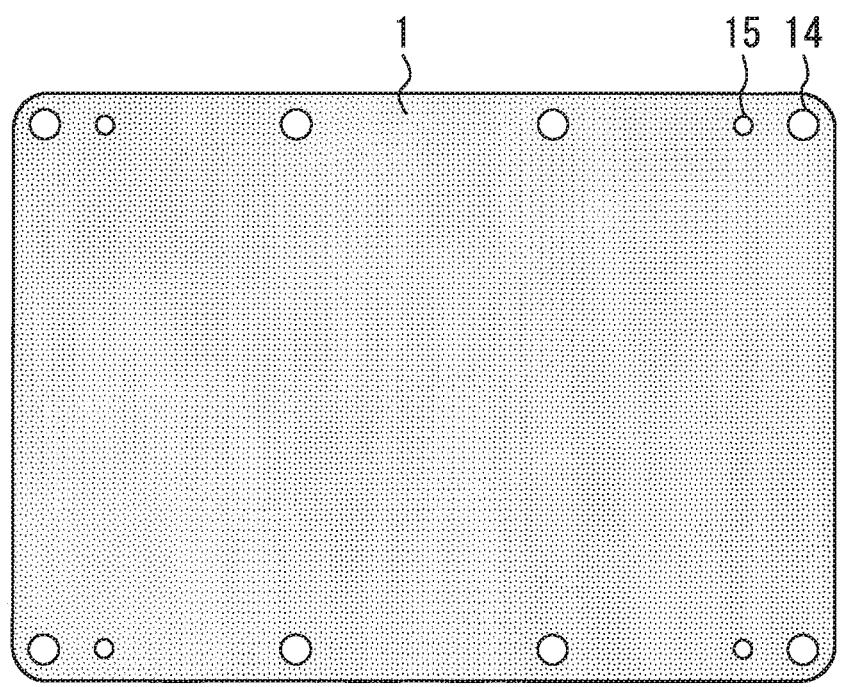
FIG. 2 is a bottom view showing the semiconductor device according to the first embodiment of the present invention.

FIG. 2 is a bottom view showing the semiconductor device according to the first embodiment of the present invention. A fitting hole 14 for fitting to a cooler and a case fitting screw hole 15 are provided to a peripheral portion of the heat radiation plate 1.

Figure 3:
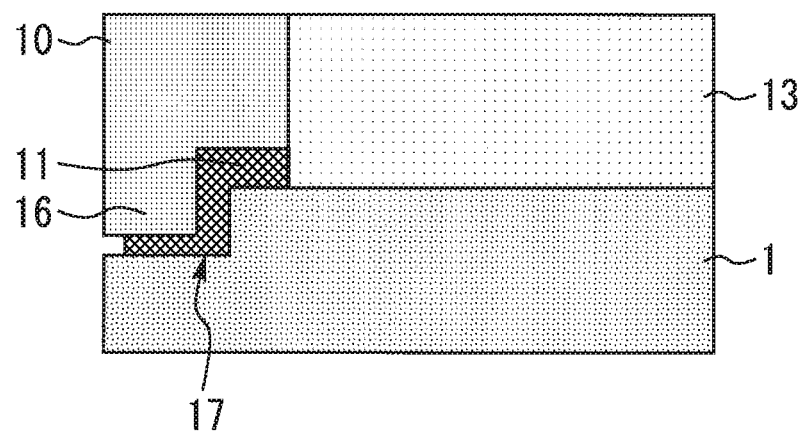
FIG. 3 is an enlarged cross-sectional view of a bonded portion between the case housing and the heat radiation plate of the semiconductor device according to the first embodiment of the present invention.

FIG. 3 is an enlarged cross-sectional view of a bonded portion between the case housing and the heat radiation plate of the semiconductor device according to the first embodiment of the present invention. As a step portion, a convex portion 16 is provided at an outer portion of the lower surface of the case housing 10, and a concave portion 17 is provided at a position facing the convex portion 16 at the upper surface peripheral portion of the heat radiation plate 1. The side surface of the heat radiation plate 1 and the outer side surface of the case housing 10 are flush with each other.

When the heat radiation plate 1 is molded by melting of metal, grooves or protrusions are provided on a mold or cast, and the peripheral portion of the heat radiation plate 1 is additionally processed during casting. Furthermore, when the concave portion 17 is formed after the surface of the heat radiation plate 1 is shaped, portions other than a portion serving as the concave portion 17 are covered with a resist mask, and the concave portion 17 is formed by etching. When resist etching is not performed, the concave portion 17 may be formed by pressing.

Figure 4:
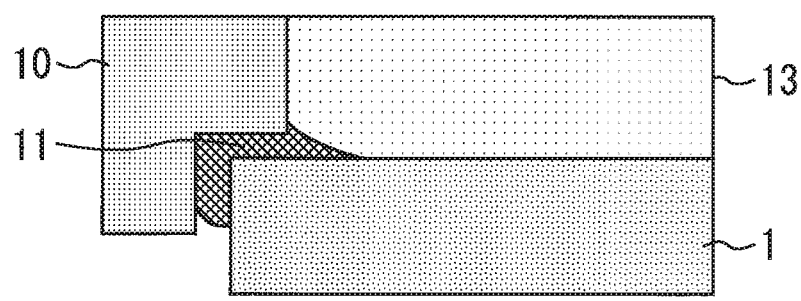
FIG. 4 is an enlarged cross-sectional view of a bonded portion between a case housing and a heat radiation plate of a semiconductor device according to the comparative example.

In the following, an effect of the present embodiment will be described in comparison with a comparative example. FIG. 4 is an enlarged cross-sectional view of a bonded portion between a case housing and a heat radiation plate of a semiconductor device according to the comparative example. In the comparative example, the case housing 10 encloses the heat radiation plate 1 in order to secure a certain volume of adhesive agent 11 coated on the heat radiation plate 1. Accordingly, the size of the heat radiation plate 1 must be made smaller than that of the case housing 10.

On the other hand, in the present embodiment, as a step portion, the convex portion 16 is provided to the outer portion of the lower surface of the case housing 10, and the concave portion 17 is provided at a position facing the convex portion 16 on the upper surface peripheral portion of the heat radiation plate 1. As a result, it is possible to secure a certain volume of the adhesive agent 11 for adhesively bonding the case housing 10 and the heat radiation plate 1, thereby ensuring the sealing effect. Furthermore, the side surface of the heat radiation plate 1 and the outer side surface of the case housing 10 are flush with each other. As a result, a heat radiation range can be expanded, so that a clearance range for securing the fitting hole 14 to the cooler and the case fitting screw hole 15 can be expanded. Therefore, it is possible to reduce the contact thermal resistance and improve the likelihood of cooling design. As a result, an advantageous lifetime design of the semiconductor device is provided.

Second Embodiment

Figure 5:
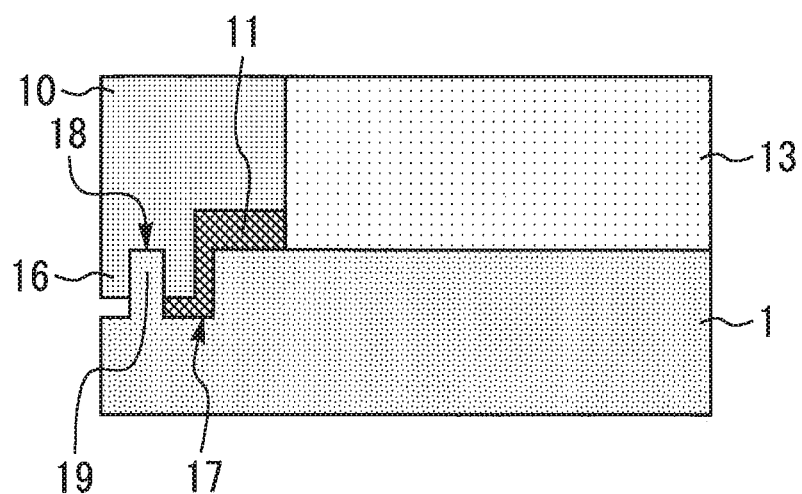
FIG. 5 is an enlarged cross-sectional view of a bonded portion between a case housing and a heat radiation plate of a semiconductor device according to a second embodiment of the present invention.

FIG. 5 is an enlarged cross-sectional view of a bonded portion between a case housing and a heat radiation plate of a semiconductor device according to a second embodiment of the present invention. In addition to the configuration of the first embodiment, a groove 18 is provided in the convex portion 16 of the case housing 10, and a protrusion 19 is provided at a position facing the groove 18 on the concave portion 17 of the heat radiation plate 1.

In addition to the same effect as the first embodiment, the groove 18 of the case housing 10 and the protrusion 19 of the heat radiation plate 1 are engaged with each other, so that leakage of the sealing material 13 and protrusion of the adhesive agent 11 can be prevented. Therefore, the productivity can be enhanced. In addition, the positioning precision of the case housing 10 is enhanced.

Third Embodiment

Figure 6:
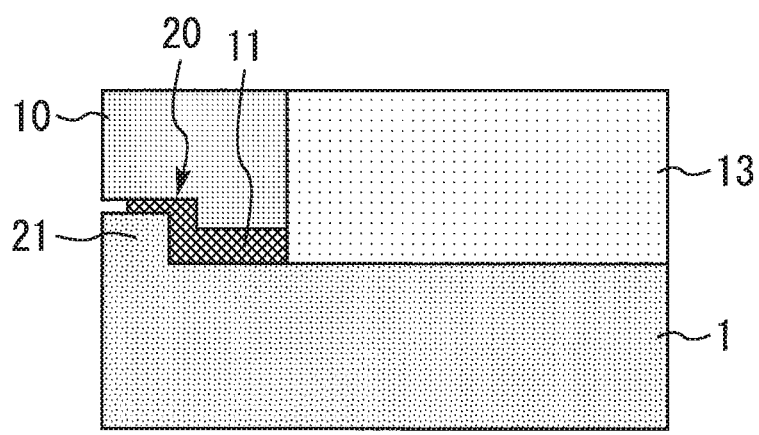
FIG. 6 is an enlarged sectional view of a bonded portion between a case housing and a heat radiation plate of a semiconductor device according to a third embodiment of the present invention.

FIG. 6 is an enlarged sectional view of a bonded portion between a case housing and a heat radiation plate of a semiconductor device according to a third embodiment of the present invention. As a step portion, a concave portion 20 is provided on the outer portion of the lower surface of the case housing 10, and a convex portion 21 is provided at a position facing the concave portion 20 on the upper surface peripheral portion of the heat radiation plate 1. In addition to the same effect as the first embodiment, it is possible to prevent leakage of the sealing material 13 and protrusion of the adhesive agent 11 by the convex portion 21 of the heat radiation plate 1, so that the productivity is enhanced.

Fourth Embodiment

Figure 7:
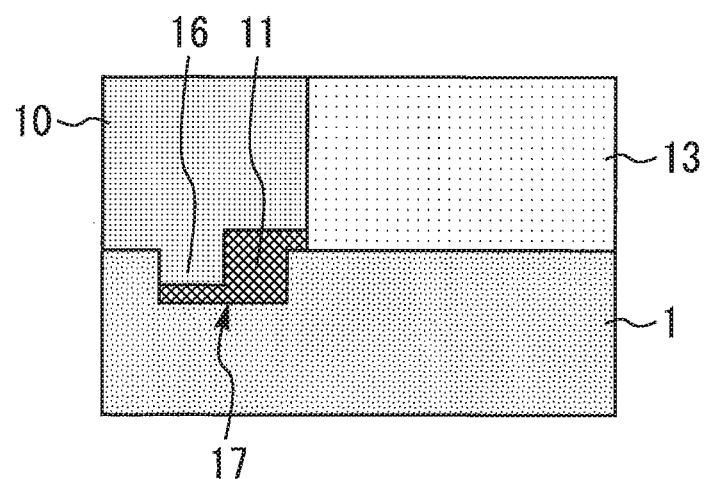
FIG. 7 is an enlarged cross-sectional view of a bonded portion between a case housing and a heat radiation plate of a semiconductor device according to a fourth embodiment of the present invention.

FIG. 7 is an enlarged cross-sectional view of a bonded portion between a case housing and a heat radiation plate of a semiconductor device according to a fourth embodiment of the present invention. A convex portion 16 is provided as a step portion at a center portion of the lower surface of the case housing 10, and a concave portion 17 is provided at a position facing the convex portion 16 on the upper surface peripheral portion of the heat radiation plate 1. As a result, in addition to the same effect as the third embodiment, the coating amount of the adhesive agent 11 can be reduced. In addition, positioning precision of the case housing 10 is enhanced.

Fifth Embodiment

Figure 8:
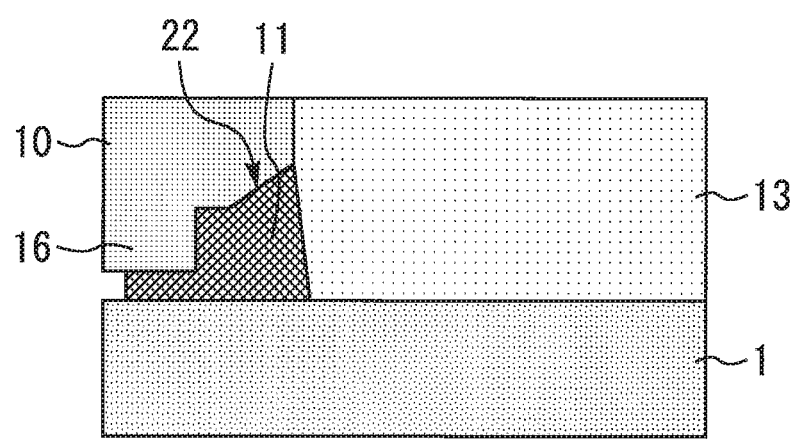
FIG. 8 is an enlarged cross-sectional view of a bonded portion between a case housing and a heat radiation plate of a semiconductor device according to a fifth embodiment of the present invention.

FIG. 8 is an enlarged cross-sectional view of a bonded portion between a case housing and a heat radiation plate of a semiconductor device according to a fifth embodiment of the present invention. As a step portion, a convex portion 16 is provided on the outer portion of the lower surface of the case housing 10, and a chamfer 22 is provided at the inner portion of the lower surface of the case housing 10. Since the adhesive agent 11 is pulled up to the case housing 10 side by surface tension acting on the chamfer 22, the volume of the adhesive agent 11 can be secured, and the sealing effect is enhanced. In addition, since it is not necessary to process the heat radiation plate 1, it is possible to reduce the cost and enhance the heat dissipation. In addition, the same effect as the first embodiment can be obtained.

Sixth Embodiment

Figure 9:
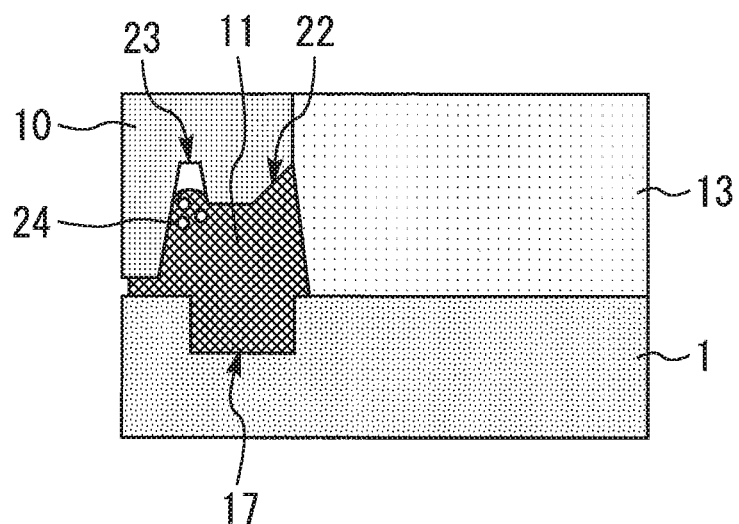
FIG. 9 is an enlarged cross-sectional view of a bonded portion between a case housing and a heat radiation plate of a semiconductor device according to a sixth embodiment of the present invention.

FIG. 9 is an enlarged cross-sectional view of a bonded portion between a case housing and a heat radiation plate of a semiconductor device according to a sixth embodiment of the present invention. In addition to the configuration of the fifth embodiment, a concave portion 17 is provided as a step portion at the upper surface peripheral portion of the heat radiation plate 1. Furthermore, an air space 23 is provided on the lower surface of the case housing 10. In addition to the same effect as the fifth embodiment, the insulation property can be enhanced by leakage of bubbles 24 in the adhesive agent 11 to the air space 23 instead of the inside of the device.

Seventh Embodiment

Figure 10:
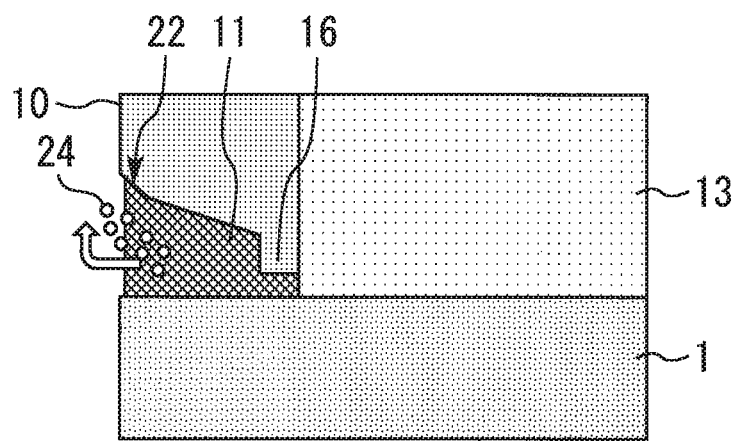
FIG. 10 is an enlarged cross-sectional view of a bonded portion between a case housing and a heat radiation plate of a semiconductor device according to a seventh embodiment of the present invention.

FIG. 10 is an enlarged cross-sectional view of a bonded portion between a case housing and a heat radiation plate of a semiconductor device according to a seventh embodiment of the present invention. A convex portion 16 is provided as a step portion at the inner portion of the lower surface of the case housing 10. Furthermore, a chamfer 22 is provided at the outer portion of the lower surface of the case housing 10. Bubbles 24 in the adhesive agent 11 leak to the outside of the device, so that the insulating property can be enhanced. In addition, the same effect as the first embodiment can be obtained.

Eighth Embodiment

Figure 11:
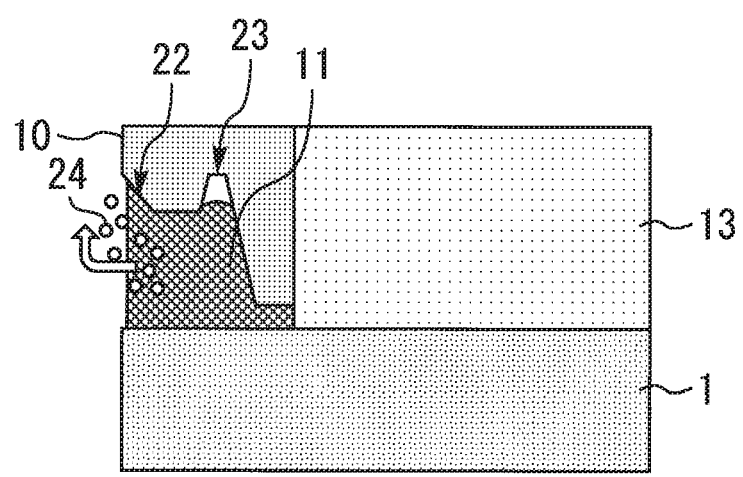
FIG. 11 is an enlarged cross-sectional view of a bonded portion between a case housing and a heat radiation plate of a semiconductor device according to an eighth embodiment of the present invention.

FIG. 11 is an enlarged cross-sectional view of a bonded portion between a case housing and a heat radiation plate of a semiconductor device according to an eighth embodiment of the present invention. In addition to the configuration of the seventh embodiment, an air space 23 is provided to the lower surface of the case housing 10. Bubbles 24 in the adhesive agent 11 leak to the outside of the device or the air space 23, thereby enhancing the insulation property.

The semiconductor chip 8 is an IGBT or a diode formed of silicon, but instead may be a SiC-MOSFET or a SiC-SBD formed of a wide-bandgap semiconductor. The wide-bandgap semiconductor is, for example, a silicon carbide, a gallium-nitride-based material, or diamond. A power semiconductor chip formed of such a wide-bandgap semiconductor has a high voltage resistance and a high allowable current density, and thus can be miniaturized. The use of such a miniaturized chip enables the miniaturization and high integration of the semiconductor device in which the chip is incorporated. Further, since the chip has a high heat resistance, a radiation fin of a heatsink can be miniaturized and a water-cooled part can be air-cooled, which leads to further miniaturization of the semiconductor device. Further, since the chip has a low power loss and a high efficiency, a highly efficient semiconductor device can be achieved.

REFERENCE SIGNS LIST

1 heat radiation plate; 2 wiring board; 8 semiconductor chip; 10 case housing; 11 adhesive agent; 13 sealing material; 16,21 convex portion; 17,20 concave portion; 18 groove; 19 protrusion; 22 chamfer; 23 air space

The invention claimed is:

1. A semiconductor device comprising:
   a heat radiation plate;
   a wiring board provided on the heat radiation plate;
   a semiconductor chip provided on the wiring board;
   a case housing provided on the heat radiation plate and surrounding the wiring board and the semiconductor chip;
   adhesive agent bonding a lower surface of the case housing and an upper surface peripheral portion of the heat radiation plate; and
   a sealing material filled in the case housing and covering the wiring board and the semiconductor chip,
   wherein a step portion is provided to at least one of the lower surface of the case housing and the upper surface peripheral portion of the heat radiation plate, and
   a side surface of the heat radiation plate and an outer side surface of the case housing are flush with each other.

2. The semiconductor device according to claim 1, wherein as the step portion, a convex portion is provided at an outer portion of the lower surface of the case housing and a concave portion is provided at a position facing the convex portion at the upper surface peripheral portion of the heat radiation plate.

3. The semiconductor device according to claim 2, wherein as the step portion, a groove is provided in the convex portion of the case housing and a protrusion is provided at a position facing the groove on the concave portion of the heat radiation plate.

4. The semiconductor device according to claim 1, wherein as the step portion, a concave portion is provided on an outer portion of the lower surface of the case housing and a convex portion is provided at a position facing the concave portion on the upper surface peripheral portion of the heat radiation plate.

5. The semiconductor device according to claim 1, wherein as the step portion, a convex portion is provided at a center portion of the lower surface of the case housing and a concave portion is provided at a position facing the convex portion on the upper surface peripheral portion of the heat radiation plate.

6. The semiconductor device according to claim 1, wherein a convex portion is provided as the step portion on an outer portion of the lower surface of the case housing, and
   a chamfer is provided at an inner portion of the lower surface of the case housing.

7. The semiconductor device according to claim 6, wherein a concave portion is provided as the step portion at the upper surface peripheral portion of the heat radiation plate, and an air space is provided on the lower surface of the case housing.

8. The semiconductor device according to claim 1, wherein a convex portion is provided as the step portion at an inner portion of the lower surface of the case housing, and a chamfer is provided at an outer portion of the lower surface of the case housing.

9. The semiconductor device according to claim 8, wherein an air space is provided on the lower surface of the case housing.

10. The semiconductor device according to claim 1, wherein the semiconductor chip is made of a wide-band-gap semiconductor.

\* \* \* \* \*